United States Patent
Mikulic et al.

(10) Patent No.: US 12,113,479 B2
(45) Date of Patent: Oct. 8, 2024

(54) OSCILLATOR CIRCUIT ARRANGEMENT

(71) Applicant: ams-OSRAM AG, Premstaetten (AT)

(72) Inventors: Josip Mikulic, Graz (AT); Gregor Schatzberger, Graz (AT)

(73) Assignee: AMS-OSRAM AG, Premstaetten (AT)

( * ) Notice: Subject to any disclaimer, the term of this patent is extended or adjusted under 35 U.S.C. 154(b) by 13 days.

(21) Appl. No.: 18/257,051

(22) PCT Filed: Dec. 14, 2021

(86) PCT No.: PCT/EP2021/085689
§ 371 (c)(1),
(2) Date: Jun. 12, 2023

(87) PCT Pub. No.: WO2022/129048
PCT Pub. Date: Jun. 23, 2022

(65) Prior Publication Data
US 2024/0072728 A1 Feb. 29, 2024

(30) Foreign Application Priority Data

Dec. 15, 2020 (DE) .......................... 102020133457.5

(51) Int. Cl.
*H03B 5/24* (2006.01)
(52) U.S. Cl.
CPC ..................... *H03B 5/24* (2013.01)
(58) Field of Classification Search
CPC ...................................................... H03B 5/24
USPC ............................................. 331/108 R, 111
See application file for complete search history.

(56) References Cited

U.S. PATENT DOCUMENTS

| | | | |
|---|---|---|---|
| 6,456,170 B1 | 9/2002 | Segawa et al. | |
| 8,912,855 B2 | 12/2014 | Hsiao | |
| 9,362,922 B2 | 6/2016 | Schatzberger | |
| 2005/0237118 A1 | 10/2005 | Mader et al. | |
| 2010/0283552 A1* | 11/2010 | Colin | H03B 5/20 331/143 |
| 2015/0349710 A1 | 12/2015 | Wang et al. | |
| 2016/0013753 A1* | 1/2016 | Tam | H03B 5/04 331/111 |

FOREIGN PATENT DOCUMENTS

WO    2013156821 A1    10/2013

OTHER PUBLICATIONS

Santos, P. (Authorized officer) International Search Report dated Apr. 4, 2022, PCT Application No. PCT/EP2021/085689, 14 pages.
(Continued)

*Primary Examiner* — Joseph Chang
(74) *Attorney, Agent, or Firm* — MH2 Technology Law Group LLP

(57) ABSTRACT

An oscillator circuit arrangement includes a switched capacitor circuit at least one capacitor selectively coupled to one of a supply terminal and a terminal for ground potential. A chopper circuit is disposed between the switched capacitor circuit and a comparator. The chopper circuit selectively couples one of input terminals and a reference potential terminal to its output terminals. A buffer circuit is coupled to the output of the comparator circuit. The buffer circuit is connected to the switched capacitor circuit and to the chopper circuit to control selective coupling operations therein.

13 Claims, 6 Drawing Sheets

(56) References Cited

OTHER PUBLICATIONS

German Search Report dated Jul. 27, 2021, DE Application No. 102020133457.5 7 pages.
Choe, K. et al. "A Precision Relaxation Oscillator with a Self-Clocked Offset-Cancellation Scheme for Implantable Biomedical SoCs" SESSION 23 / PLLs And Clocks / 23.7; Solid-State Circuits Conference—Digest of Technical Papers, ISSCC 2009. IEEE, Piscataway, NJ, USA, Feb. 8, 2009.
Paidimarri, A. et al. "An RC Oscillator With Comparator Offset Cancellation" IEEE Journal of Solidstate Circuits, vol. 51, No. 8, Aug. 2016; pp. 1866-1877.
Wang, J. et al. A 13.5-MHz Relaxation Oscillator with ±0.5% Temperature Stability for RFID Application 2016 IEEE International Symposium On Circuits and Systems (ISCAS), IEEE, May 22, 2016; pp. 2431-2434.
Mng Cao et al.: "A 63,000 Q-factor relaxation oscillator with switchedcapacitor integrated error feedback" Conference Paper in Digest of Technical Papers; IEEE International Solid-State Circuits Conference; Feb. 2013; DOI:10.1109/ISSCC.2013.6487693.

\* cited by examiner

OSCILLATOR CIRCUIT ARRANGEMENT

CROSS-REFERENCE TO RELATED APPLICATIONS

This patent application is a national stage entry from International Application No. PCT/EP2021/085869, filed on Dec. 14, 2021, published as International Publication No. WO 2022/129048 A1 on Jun. 23, 2022, and claims priority to German patent application 102020133457.5 filed on Dec. 15, 2020, the disclosures of all of which are hereby incorporated by reference.

TECHNICAL FIELD

The present disclosure relates to an oscillator circuit arrangement. Specifically, the present disclosure relates to an oscillator circuit arrangement that includes a switched capacitor circuit, a comparator circuit and a buffer circuit to generate a clock signal. The present disclosure also relates to an electronic device including an oscillator circuit arrangement.

BACKGROUND

Oscillators are widely used in electronic devices to generate a stable clock signal to operate clock driven digital circuits. Relaxation oscillators may be used instead of quartz-based oscillators since they can be fully integrated on an integrated circuit and require no external elements such as a quartz component. Relaxation oscillators are often used for low frequency applications in the range of kHz up to several hundreds of kHz.

The stability of the frequency of the output clock signal depends on variations of the parameters of the components used in the oscillator design such as the parameters of the reference elements like resistors and capacitors which are often technology-dependent and on the non-idealities of the comparator. A comparator usually has an offset voltage which affects the switching threshold of the comparator. The switching of the comparator relative to its threshold voltage depends on the offset voltage which is often individual to every single oscillator so that the frequency of the output clock signal is dependent on the offset voltage of the comparator used in the relaxation oscillator.

Conventional relaxation oscillator designs include a switched capacitor stage that generates an oscillating signal forwarded to a comparator. The comparator compares this signal with a threshold voltage that may be generated by a reference voltage source, wherein the switching of the comparator involves the individual offset voltage and delay times for falling and rising signal transitions. An output stage generates the output clock signal and provides control signals to control operation of the switched capacitor stage. The switched capacitor stage may have various design variants including a rotating capacitor or an RC-design. The output stage may include flip-flops such as toggle flip-flops or D-flip-flops including those that perform a frequency division to adopt the output signal of the comparator to the control needs in the switched capacitor stage.

With the increasing demand for relaxation oscillators in future electronic circuits, there is a need for a relaxation oscillator that generates an output clock signal having a highly stable and predictable frequency. The output frequency should be independent from the comparator offset voltage. Furthermore, the effect of variations of the supply voltage on the output frequency should be as low as possible and the output frequency should be less temperature-dependent.

It is an object of the present disclosure to provide an oscillator circuit arrangement that generates an output clock signal having a stable output frequency.

It is another object of the present disclosure to provide an oscillator circuit arrangement that generates an output clock signal having a frequency which is less or even not dependent on a comparator offset voltage and variations of temperature and supply voltage.

It is yet another object of the present disclosure to provide an oscillator circuit arrangement that is less complex although providing an output clock signal with a stable frequency.

SUMMARY

One or more of the above-mentioned objects are resolved by an oscillator circuit arrangement comprising the features of present claim 1.

According to an embodiment, an oscillator circuit arrangement comprises a switched capacitor circuit. The switched capacitor circuit includes a supply terminal, a terminal for ground potential and an output terminal coupled to downstream connected circuit stages. The switched capacitor circuit includes one or more capacitors. At least one of the capacitors is operated in switched mode wherein at least one terminal of the switched capacitor is connected to nodes carrying different potentials. A terminal of the switched capacitor may be selectively connected to one or more of a ground potential terminal, a supply terminal or an output terminal of the switched capacitor circuit, etc. Specifically, the switched capacitor circuit may be configured to selectively couple the at least one terminal of the at least one capacitor to the supply terminal or the ground potential terminal. The switched capacitor circuit may have many different designs including a rotation capacitor design which includes a switched capacitor that is rotated sequentially so that its polarity is sequentially changed between two connection terminals.

The oscillator circuit arrangement includes a chopper circuit upstream of a comparator circuit, wherein the chopper circuit performs chopping of the input signals to the comparator. The chopper circuit may include first and second input terminals connected to the switched capacitor circuit and a reference potential terminal as well as first and second output terminals connected to inputs of the comparator. The chopper circuit is configured to perform a chopping operation, wherein the chopper circuit selectively couples the first output terminal to the first input terminal or the reference potential terminal and selectively couples the second output terminal to the second input terminal or the reference potential terminal. In one operational stage, one of these connections is enabled, in a subsequent operational stage, the other one of these connections is enabled and so forth. The comparator circuit is a conventional comparator connected to the chopper stage at its input side. The comparator may exhibit an inherent switching offset voltage.

A buffer circuit is connected downstream to the comparator to buffer, decouple and generate the output clock signal and control signals for feedback to the upstream connected stages such as the switched capacitor circuit and the chopper circuit. The feedback signals control switches within the switched capacitor circuit to perform the switched capacitor operation and switches within the chopper circuit to perform the chopping operation to ensure a phase-correct switching of the switched capacitor and chopper circuits to allow generation of an output clock signal having a stable frequency.

According to an embodiment, the chopper circuit performs a chopping operation in that the first input terminal is connected to the first output terminal and the reference potential terminal is connected to the second output terminal. Subsequently, the second input terminal is connected to the second output terminal and the reference potential terminal is connected to the first output terminal. The chopping operation cancels the influence of the input referred offset voltage of the comparator from the output frequency so that the frequency of the output clock signal is independent from the offset voltage of the comparator. The output frequency depends mostly from parameters of components used in the oscillator circuit such as the resistance of a resistor used and the capacitance of a capacitor used in the switched capacitor circuit as well as switching delays of the comparator. The output clock frequency no longer depends from the comparator offset voltage. The effect of delays of falling and rising signal transitions at the comparator on the output frequency is relatively small when compared to the other contributions so that the variations of the high-to-low switching delay and the low-to-high switching delay of the comparator affect only in a subordinated manner the output frequency.

According to an embodiment, the chopper circuit includes switches disposed between the first input terminal and the first output terminal, between the reference potential terminal and the first output terminal, between the reference potential terminal and the second output terminal and between the second input terminal and the second output terminal. The first and the third switches are operated synchronously or in phase with each other, and the second and the fourth switches are operated synchronously or in phase with each other, while the first and third switches are operated inversely or complementary or out of phase with the second and fourth switches to enable a chopping operation on the signals supplied from the switched capacitor stage to the comparator stage.

According to an embodiment, the buffer stage includes one or more buffers. The buffer connected to the output of the comparator provides the control signals for the switches of the chopper circuit. The input to said buffer, which is the output of the comparator, is forwarded to the second and fourth switches of the chopper circuit and the output of said buffer is connected to the first and third switches so that the buffer provides complementary control signals to be forwarded to the switches of the chopper circuit so that the chopper circuit is switched with every output clock cycle and with the same frequency as the output clock signal.

According to an embodiment, the switched capacitor circuit may be realized as a rotating capacitor circuit which includes a capacitor of which the first and second capacitor terminals are connected to supply terminal and ground potential terminal of the switched capacitor circuit in one instance and are rotated subsequently so that the terminals are connected inversely to reverse the polarity of the capacitor in that the second capacitor terminal is connected to the supply terminal and the first capacitor terminal is connected to the ground potential terminal. The rotation operation inverts and thereby rotates the capacitor polarity between two terminals in a consecutive manner by the operation of corresponding switches that connect the first terminal of the switched capacitor to supply and ground terminals and the second capacitor terminal to ground and supply terminals. At least two switches are connected to each one of the capacitor terminals that are operated inversely or complementary with each other so that one of the switches is closed or conductive when the other one of the switches connected to the same capacitor terminal is open or non-conductive. In the case of a rotating capacitor circuit, the supply terminal of the rotating capacitor terminal is connected to the output terminal of the rotating capacitor circuit to be forwarded to the chopper circuit. Operation of the switches in the rotating capacitor circuit is controlled by input and output signals of the buffer in the buffer stage.

The switches in the switched capacitor circuit as well as the chopper circuit are realized by transistors such as MOS transistors. Transistors coupled to the high potential side have inverse polarity compared to transistors coupled to the low potential side. p-MOS-transistors may be used for switches connected to the supply terminal, n-MOS-transistors may be used for switches connected to the ground potential terminal.

According to an embodiment, the rotating capacitor circuit may include another capacitor which is connected between the output terminal and the supply terminal of the rotating capacitor circuit and the ground potential terminal. In one operational stage, the two capacitors with the rotating capacitor stage are charged in parallel to each other or simultaneously. Then, the polarity of the rotating capacitor is reversed so that both capacitors are rapidly discharged to zero. Then, both capacitors are again charged in parallel to each other and so forth.

According to another embodiment, the switched capacitor circuit may comprise another capacitor of which one terminal is selectively connected to ground potential terminal and the supply potential terminal. Both switched capacitors have corresponding structures and the switches are controlled complementary to each other. The output terminals of the switched capacitor circuit are forwarded to the first and second input terminals of the chopper circuit.

The circuit design is flexible in that also other switched capacitor circuits can be used to supply a ramping signal to the input terminals of the chopper circuit. The rotating capacitor circuit may be also realized as an RC structure rather than with a second capacitor.

The switched capacitor circuit and the rotating capacitor circuit both comprise a supply terminal which is used to supply current to charge the capacitors within the circuit. According to an embodiment, the supply terminal may be connected to a constant current source to supply the capacitors with a constant current to charge the capacitors continuously.

The reference voltage to be supplied to the reference voltage terminal of the chopper circuit may receive a voltage reference which is generated from a reference voltage circuit including another constant current source. The constant current source supplies the current to a resistor so that the reference voltage can be obtained at the node disposed between the constant current source and said resistor. The constant current source of the reference voltage circuit may supply the same amount of current as the constant current source connected to the supply terminal of the switched capacitor circuit.

According to another embodiment, the current at the supply terminal of the switched capacitor circuit may be supplied by a resistor connected to a supply potential terminal, which may be an ohmic resistor. The resistor provides a current which depends on the voltage at the supply terminal so that charging of the capacitors has an exponential form. In this embodiment, the reference voltage to be supplied to the reference voltage terminal of the chopper circuit may be generated by a voltage divider connected between supply potential terminal and ground potential terminal. The voltage divider may be an ohmic voltage divider having first and second ohmic resistors. The ohmic resistors of the voltage divider may have different resistance values. A node disposed between the resistors is connected to the reference voltage terminal of the chopper circuit. The use of a resistor for current supply to the switched capacitor stage and of an ohmic voltage divider to supply the reference potential to the chopper circuit reduces the effect of variations of the supply voltage on the output frequency so that the output frequency has increased stability. Furthermore, circuit complexity is reduced.

The above-described oscillator circuit arrangement may be used in an electronic device which comprises a digital circuit portion that operates clockwise in response to a clock signal such as a processor and/or a circuit that includes measurement circuitry or analog-to-digital converter circuitry working along a switched capacitor working principle. The oscillator circuit arrangement provides a time base to the operation of the digital circuit portion. The output clock signal from the oscillator circuit arrangement generates the clock signal for the operation of the digital circuit portion including additional buffering and/or frequency multiplication and/or frequency division of the output clock signal from the oscillator circuit arrangement.

The above-described embodiments of the oscillator circuit arrangement may be used in industry applications or other technical fields that require a fully integrated on-chip oscillator without a quartz component such as time-of-flight sensors or ambient light sensors. These applications often require only moderate frequencies in the range of hundreds or several hundred of kHz. The above-described concepts may cover operating frequencies even down to very low frequencies in the range of several Hz.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments. The same elements in different figures of the drawings are denoted by the same reference signs.

DETAILED DESCRIPTION OF THE EMBODIMENTS

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
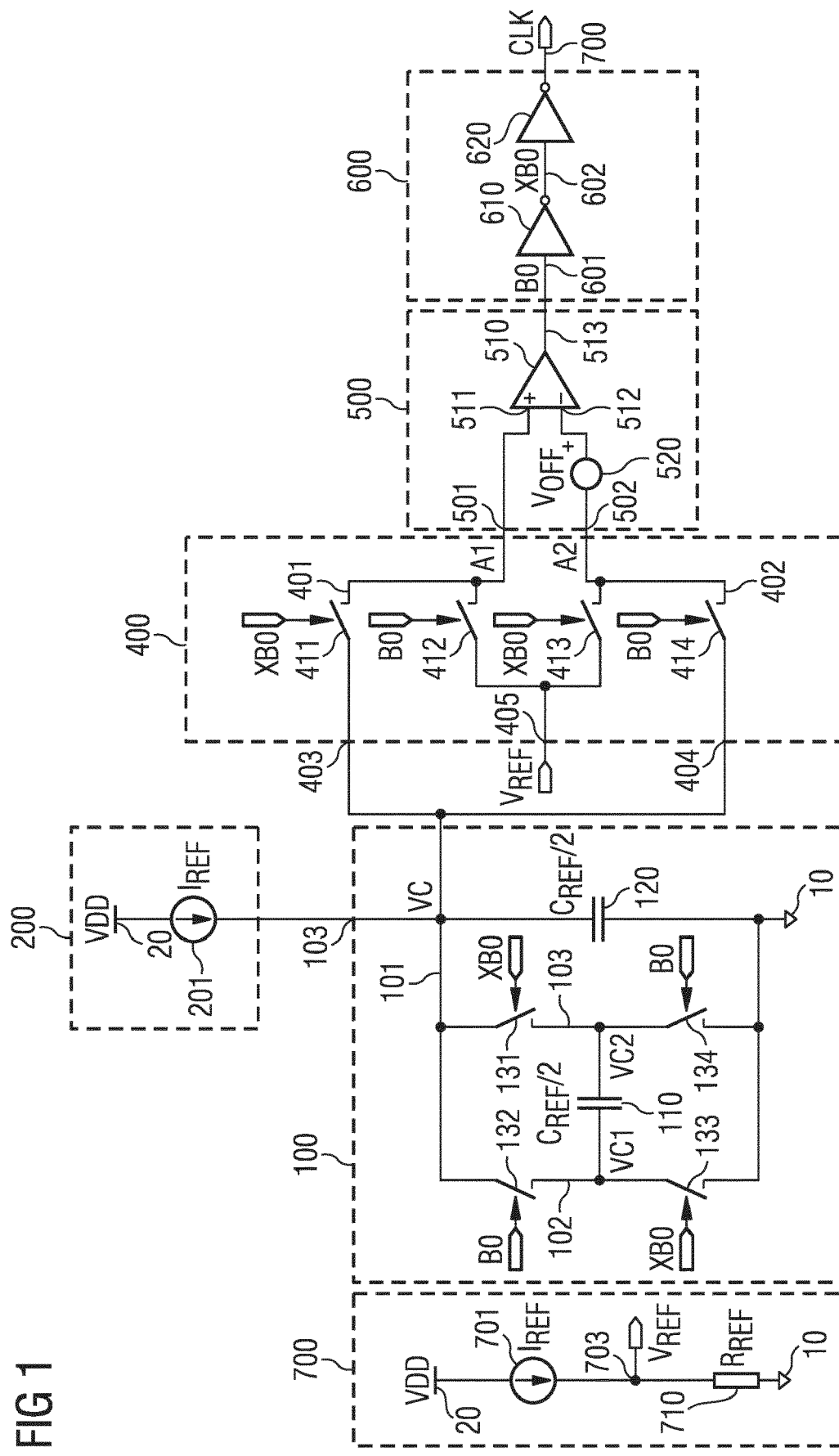
FIG. 1 shows an embodiment of an oscillator circuit arrangement according to the principles set forth in this disclosure.

FIG. 1 shows an oscillator circuit arrangement that can be integrated in an integrated CMOS circuit avoiding the need for an external quartz time base. More specifically, the oscillator circuit includes a rotating capacitor integrator circuit 100, a reference current circuit 200, a chopper circuit 400, a reference voltage circuit 700, a comparator circuit 500 and a logic circuit 600. The rotating capacitor integrator circuit 100 includes a current receiving terminal 103 to which constant current source 201 generating current IREF is connected. Constant current source 201 is connected between terminal 103 and supply voltage terminal 20 for supply voltage VDD. The rotating capacitor integrator block 100 includes two capacitors 110, 120, each having a capacitance value equal to CREF/2. Capacitor 110 is a switched capacitor connected to four switches 131, 132, 133, 134. Capacitor 120 is connected between integrating node 101 carrying integrating voltage VC and ground potential terminal 10. The integrating node 101 is connected to current supply terminal 103 and also forms the output of rotating capacitor circuit 100. One terminal 102 of capacitor 110 is connected through switch 132 to integration node 101 and through switch 133 to ground potential terminal 10. Another terminal 103 of capacitor 110 is connected through switch 131 to node 101 and through switch 134 to ground potential terminal 10. Switches 132, 133 are operated by inverse or complementary signals B0, XB0 supplied by buffer circuit 600 so that switches 132, 133 operate out-of-phase or complementary to each other. Switches 131, 134 are controlled by signals XB0, B0, operating out-of-phase or complementary to each other. Furthermore, switches 132, 131 operate complementary to each other and switches 133, 134 operate complementary to each other. Switches 131, . . . , 134 cause a rotating operation of capacitor 110 in that, at one instance, terminal 102 is connected to node 110 and terminal 103 is connected to ground potential terminal 10 and, in a subsequent instance, the polarity of the capacitor 110 is changed in that terminal 103 is connected to node 101 and terminal 102 is connected to ground potential terminal 10. Each one of the switches 131, . . . , 134 is closed or conductive when the corresponding control signal applied to the switch is logic high "1" and is open or non-conductive when the corresponding control signal is logic low "0".

Comparator 500 comprises first and second input terminals 501, 502 and an output terminal 513. Comparator 500 is represented by an ideal comparator 510 plus an offset voltage source 520 generating voltage VOFF connected to the negative input terminal 512. While the ideal comparator 510 switches when the signal at terminal 511 exceeds the signal at terminal 512, a switching of a real comparator 500 occurs if the signal at terminal 501 is higher than the signal at terminal 502 plus the offset voltage VOFF. A real comparator always has an input referred offset voltage mainly due to asymmetries within its components. The actual offset voltage may vary in a certain range from comparator to comparator so that the output frequency of a conventional oscillator depends largely on the offset voltage.

A chopper stage 400 is connected between the output 101 of the rotating capacitor stage 100 and the comparator 500. The chopper stage includes input terminals 403, 404 both connected together to output terminal 101 of capacitor stage 100, and output terminals 401, 402 connected to the input terminals 501, 502 of comparator 500. Reference terminal 405 of chopper stage 400 is connected to reference voltage circuit 700. Chopper block 400 comprises four switches, 411, 412, 413, 414 selectively connecting the input and reference potential terminals of chopper stage 400 to its output terminals. Switch 411 is connected between input terminal 403 and output terminal 401, switch 412 is connected between reference potential terminal 405 and output terminal 401. Switch 413 is connected between reference potential terminal 405 and output terminal 402. Switch 414 is connected between input terminal 404 and output terminal 402. Switches 411, 412 are operated inversely or complementary to each other by control signals XB0, B0, respectively, and switches 413, 414 are operated inversely or complementary to each other by control signals XB0, B0, respectively. Accordingly, output terminal 401 is connected selectively either to output terminal 101 of switched capacitor stage 100 or reference potential terminal 405. Output terminal 402 is selectively connected either to reference potential terminal 405 or output terminal 101 of switched capacitor stage 100. The control signals of chopper stage 400 are supplied by buffer stage 600.

Buffer stage 600 comprises one or more buffers to provide driving strength of the output clock signal CLK at output terminal 700 of logic block 600 which is the output signal of the oscillator circuit and to decouple signals from each other. Buffer block 600 comprises a first inverter buffer 610 connected to the output 513 of comparator 500. Another inverter buffer 620 is connected downstream to the buffer 610 and provides the output signal CLK at its output terminal 700. Buffer 620 has sufficient driving power to distribute the clock signal CLK to the digital circuits supplied with the clock signal CLK. The control signal B0 is taken at the input of buffer stage 600 and the input of the first buffer 610, and the inverse control signal XB0 is taken at the output of the first buffer 610. Control signals B0, XB0 are fed back to the switches 131, . . . , 134 of rotating capacitor circuit 100 and the switches 411, . . . , 414 of chopper stage 400 to control the capacitor rotation operation in rotating capacitor circuit 100 and the chopping operation in chopper stage 400, as explained above.

The reference voltage VREF at terminal 405 is generated by the voltage generator circuit 700 which includes a constant current source 701 to generate current IREF. Current source 701 may generate a current with the same strength as constant current source 201. Current source 710 is connected to supply voltage terminal 20 and supplies the current IREF to a reference resistor 710 further connected to ground potential terminal 10. Resistor 710 has a resistance value of RREF. Current source 701 generates a constant current supplied to resistor 710 so that terminal 703 disposed between current source 701 and resistor 710 carries a constant reference potential VREF to be supplied to terminal 405 of chopper stage 400.

A startup circuit (not shown) initializes the switches to start the oscillation operation. During operation of the oscillator circuit of FIG. 1, capacitor 110 is rotated at the frequency of the output signal CLK by control signals B0, XB0 so that in one instance, both capacitors 110, 120 are charged with a constant current by current source 201. Then, capacitor 110 is rotated so that its terminals 102, 103 are connected with inverse polarity so that capacitors 110, 120 discharge immediately to zero by equalizing the opposite charges carried in capacitors 110, 120. Then, capacitors 110, 120 are again charged by current source 201, and capacitor 110 is again rotated and discharged and the process is repeated so that signal VC at terminal 101 has a saw tooth shape. Chopper stage 400 exchanges the signals A1, A2 at its output terminals 401, 402 which generate a switching signal at the output of the comparator 500 upon a transition of the signals at the inputs 501, 502 of comparator 500 further considering the effect of the offset voltage VOFF. Control of circuits 100 and 400 is performed by the control signals supplied by the output buffer stage 600. The switches are operated with a suitable phase or polarity relation in response to the output signal of the comparator 500 or the output clock signal CLK derived therefrom, wherein the switches are operated at the frequency of the output signal CLK.

The buffer circuit 600 includes inverter buffers only and includes no memory elements such as flip-flops, flip-flops with a feedback loop or the like. Accordingly, there is a direct control path from the output of the comparator 500 to the switches in the rotating capacitor stage 100 and the chopper stage 400. This avoids unstable situations that may occur in conventional circuits using toggling flip-flops.

The oscillator circuit of FIG. 1 avoids hang-up of the oscillation, for example, in the case of an EMI (electromagnetic interference) event or a strong voltage variation. A stop of oscillation due to hang-up by the flip-flops would be detrimental since a stable clock time base is a crucial function in an integrated circuit. The circuit of FIG. 1 provides a stable operation which is robust against EMI events or voltage variations in that it self-recovers from an EMI disturbance.

Figure 2:
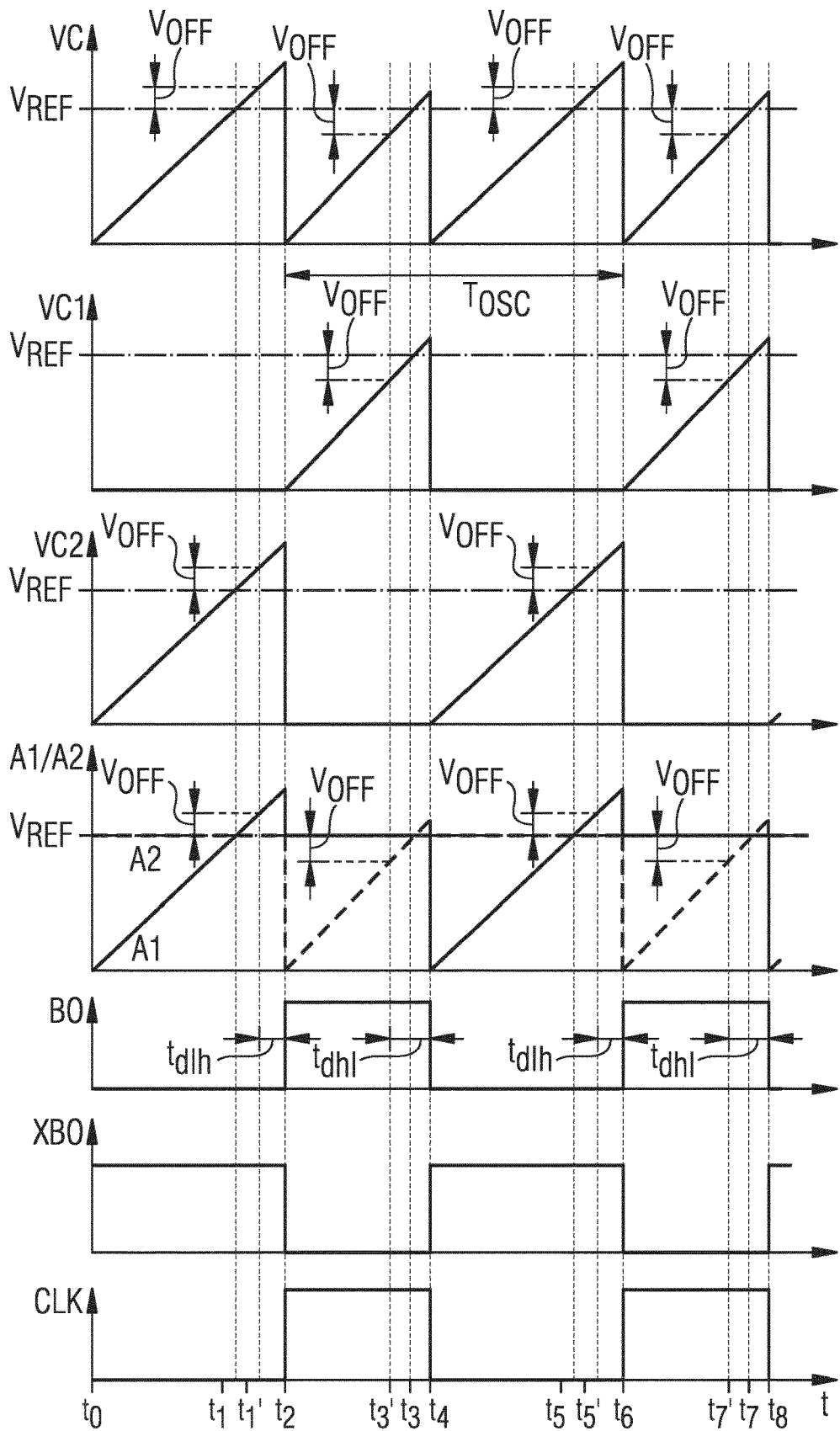
FIG. 2 shows a waveform diagram of signals from the circuit of FIG. 1.

FIG. 2 shows the waveforms of several signals over time from representative circuit nodes of FIG. 1. The detailed operation of the circuit of FIG. 1, represented by the signals depicted in FIG. 2, is explained below. The symbol "←" represents a dynamic event in that the voltage or potential at the left end of the symbol "←" assumes or is driven to the voltage or potential at the right end of the symbol "←". For example, VC2←VC means that signal VC2 achieves the voltage of signal VC so that after the transition VC2=VC.

The reference voltage VREF at terminal 405 generated within the reference generator circuit 700 is related to the reference current as follows:

$$V_{REF}=I_{REF} \cdot R_{REF} \tag{1}$$

It is assumed that at $t=t_0$ all the signals are in the default state ensured by the start-up circuit and that the supply voltage $V_{DD}$ and reference voltage $V_{REF}$ are settled.

$$VC=VC1=VC2=A1=A2=0. \tag{2}$$

$$B0='0' \text{ (low)}. \tag{3}$$

$$XB01='1' \text{ (high)}. \tag{4}$$

$$CLK='0' \text{ (high)}. \tag{5}$$

As a result of the circuit state, the following is true:
Switches 131, 133, 411 and 413 are closed (132, 134, 412, and 414 are open)
VC2←VC
VC1←GND
A1←VC
A2←$V_{REF}$ Capacitor 110 and 120 are connected in parallel, having the total capacitance equal to $C_{REF}$ Node A1←VC2←VC is charged with the reference current $I_{REF}$ Consequently, the following formula describes the waveform of A1←VC2←VC within the time interval ($t_0$~$t_2$):

$$A1(t) = VC2(t) = VC(t) = \frac{I_{REF}}{C_{REF}}(t - t_0) \quad (6)$$

At t=$t_1$ voltage A1 becomes equal to the reference voltage A2←$V_{REF}$. Nevertheless, the comparison only begins at t=$t_1$' when A1 becomes equal to ($V_{REF}$+$V_{OFF}$), resulting from the input referred offset voltage of the comparator. Moreover, as a result of the comparator delay, additional time is needed in order to change the state of the comparator output from low to high state, namely $t_{dlh}$. Finally, the state of the comparator output B0 becomes high at t=$t_2$.

As a result of the change of the state of the comparator output B0, the following is true at $t_{2+}$:
- B0='1' (high)
- XB0='0' (low)
- CLK='1' (high)
- Switches 132, 134, 412, and 414 are closed (131, 133, 411 and 413 are open)
- VC1←VC
- VC2←GND
- A1←$V_{REF}$
- A2←VC Since the charges of capacitors 110 and 120 are equal at t=$t_{2-}$, at t=$t_{2+}$ the charges are redistributed between the capacitors and equal zero Capacitor 110 and 120 are connected in parallel, having the total capacitance equal to $C_{REF}$ Node A2←VC1←VC is charged with the reference current $I_{REF}$, having 0 V at t=$t_{2+}$ as a result of zero charge on the capacitors 110 and 120

Consequently, the following formula describes the waveform of A2←VC1←VC within the time interval ($t_2$~$t_4$):

$$A2(t) = VC1(t) = VC(t) = \frac{I_{REF}}{C_{REF}}(t - t_2) \quad (7)$$

At t=$t_3$ voltage A2 becomes equal to the reference voltage A1←$V_{REF}$. Nevertheless, the comparison only begins at t=$t_3$' when A2 becomes equal to ($V_{REF}$−$V_{OFF}$), resulting from the offset voltage of the comparator. Moreover, as a result of the comparator delay, additional time is needed in order to change the state of the comparator output from high to low state, namely $t_{dhl}$. Finally, the state of the comparator output B0 becomes low at t=$t_4$.

As a result of the change of the state of the comparator output B0, the following is true at $t_{4+}$:
- B0='0' (low)
- XB0='1' (high)
- CLK='0' (low)
- Switches 131, 133, 411 and 413 are closed (132, 134, 412, and 414 are open)
- VC1←GND
- VC2←VC
- A1←VC
- A2←$V_{REF}$ Since the charges of capacitors 110 and 120 are equal at t=$t_{4-}$, at t=$t_{4+}$ the charges are redistributed between the capacitors and equal zero Capacitor 110 and 120 are connected in parallel, having the total capacitance equal to $C_{REF}$ Node A1←VC2←VC is charged with the reference current $I_{REF}$, having 0 V at t=$t_{4+}$ as a result of zero charge on the capacitors 110 and 120

Consequently, the following formula describes the waveform of A1←VC2←VC within the time interval ($t_4$~$t_6$):

$$A1(t) = VC2(t) = VC(t) = \frac{I_{REF}}{C_{REF}}(t - t_4) \quad (8)$$

At t=$t_5$ is voltage A1 becomes equal to the reference voltage A2←$V_{REF}$. Nevertheless, the comparison only begins at t=$t_5$' when A1 becomes equal to ($V_{REF}$+$V_{OFF}$) resulting from the offset voltage of the comparator. Moreover, as a result of the comparator delay, additional time is needed in order to change the state of the comparator output from low to high state, namely $t_{dlh}$. Finally, the state of the comparator output B0 becomes high at t=$t_6$.

From the analysis it can be concluded that the circuit has a periodic behavior, for instance, since the time interval ($t_4$~$t_6$) is identical to the time interval ($t_0$~$t_2$), the following time interval ($t_6$~$t_8$) is identical to the time interval ($t_2$~$t_4$), and so on.

For this reason, the time interval ($t_2$~$t_6$) completely describes one period of the circuit, and the oscillation period can be expressed as $$T_{OSC}=t_6-t_2=(t_3'-t_2)+(t_4-t_3')+(t_5'-t_4)+(t_6-t_5'). \quad (9)$$

From (7), the following is valid:

$$VC(t_3') = \frac{I_{REF}}{C_{REF}}(t_3' - t_2) \quad (10)$$

$$VC(t_3') = V_{REF} - V_{OFF}, \quad (11)$$

$$t_3' - t_2 = (V_{REF} - V_{OFF})\frac{C_{REF}}{I_{REF}} \quad (12)$$

Furthermore, from (8), the following is valid $$VC(t_5') = \frac{I_{REF}}{C_{REF}}(t_5' - t_4), \quad (13)$$

$$VC(t_5') = V_{REF} + V_{OFF}, \quad (14)$$

$$t_5' - t_4 = (V_{REF} + V_{OFF})\frac{C_{REF}}{I_{REF}}. \quad (15)$$

Also, the time intervals ($t_3$'~$t_4$) and ($t_5$'~$t_6$) are already defined as $$(t_4-t_3')=t_{dhl}, \quad (16)$$

$$(t_6-t_5')=t_{dlh}. \quad (17)$$

Consequently, the oscillation period can be expressed as:

$$T_{osc} = (V_{REF} - V_{OFF})\frac{C_{REF}}{I_{REF}} + t_{dlh} + (V_{REF} + V_{OFF})\frac{C_{REF}}{I_{REF}} + t_{dhl}, \quad (18)$$

or simplified:

$$T_{osc} = 2\frac{V_{REF} \cdot C_{REF}}{I_{REF}} + t_{dlh} + t_{dhl}. \tag{19}$$

Furthermore, according to (1) the following is valid:

$$\frac{V_{REF}}{I_{REF}} = R_{REF}, \tag{20}$$

meaning the final expression for the oscillation period is $$T_{osc}=2 \cdot R_{REF} \cdot C_{REF}+t_{dlh}+t_{dhl}. \tag{21}$$

As a result, according to (21), the oscillation period is determined by the reference elements, $R_{REF}$ and $C_{REF}$, and propagation delays of the comparator, $t_{dlh}$ and $t_{dhl}$, while the contribution of the offset voltage is cancelled.

The frequency of the output clock signal CLK is independent from the offset voltage VOFF of comparator 500 as it is cancelled out by the chopping operation of chopper circuit 400. The propagation delays of the comparator for rising and falling signal transitions may have a tolerance so that their absolute value may vary between real comparators. However, as these delays are relatively small and correspondingly their variation are even smaller, the effect of varying propagation delay in formula (21) is almost negligible.

Figure 3:
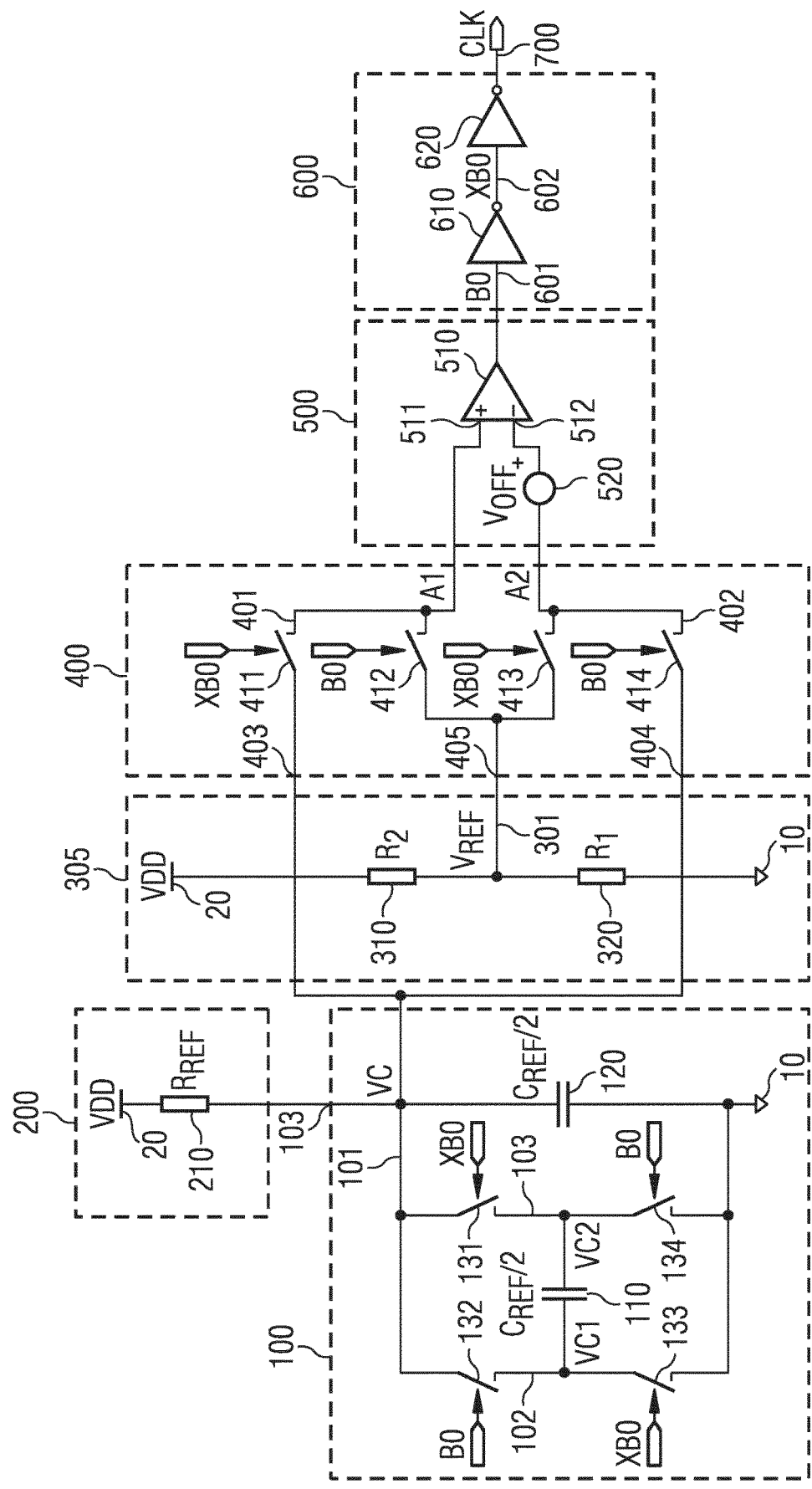
FIG. 3 shows another embodiment of an oscillator circuit arrangement according to the principles set forth in this disclosure.

FIG. 3 shows an alternative embodiment of an oscillator circuit arrangement according to the principles of this disclosure which uses a different current source circuit 200 at the current supply input 103 of the rotating capacitor circuit 100 and a different circuit 305 to generate the reference voltage VREF to be supplied to terminal 405 of the chopper stage 400. In current source circuit 200, a reference resistor 210, which may be an ohmic resistor, is connected between supply voltage terminal 20 and current supply input 103. Resistor 210 has a resistance of RREF. The current supplied to terminal 103 in the circuit of FIG. 3 varies in dependence on the voltage VC at node 101 so that the voltage VC at node 101 has an exponential behaviour, different from a linear behaviour in the circuit of FIG. 1. Further to FIG. 3, the reference voltage VREF at terminal 405 is generated by a voltage divider 305 comprising resistors 310, 320 connected in series between supply potential terminal 20 and ground potential terminal 10. The resistors 310, 320 have, in general, resistance values of R2, R1, respectively. Resistors 310, 320 may be ohmic resistors so that voltage divider 305 is an ohmic voltage divider. The reference voltage VREF is taken at the node 301 between resistors 310, 320. The circuit of FIG. 3 is less complex, since current source circuit 200 and reference generator circuit 305 are purely passive and ohmic resistor networks so that complexity and power consumption are reduced while keeping a similar level of performance. The use of ohmic resistors to generate the reference voltage VREF and of a resistor to generate a supply current to the switched capacitor circuit at current supply terminal 103 reduces effects of varying supply voltage to the output frequency, since a voltage change of the supply voltage VDD at supply terminal 20 has a parallel effect on both the current at terminal 103 and on the reference voltage VREF at terminal 301.

Figure 4:
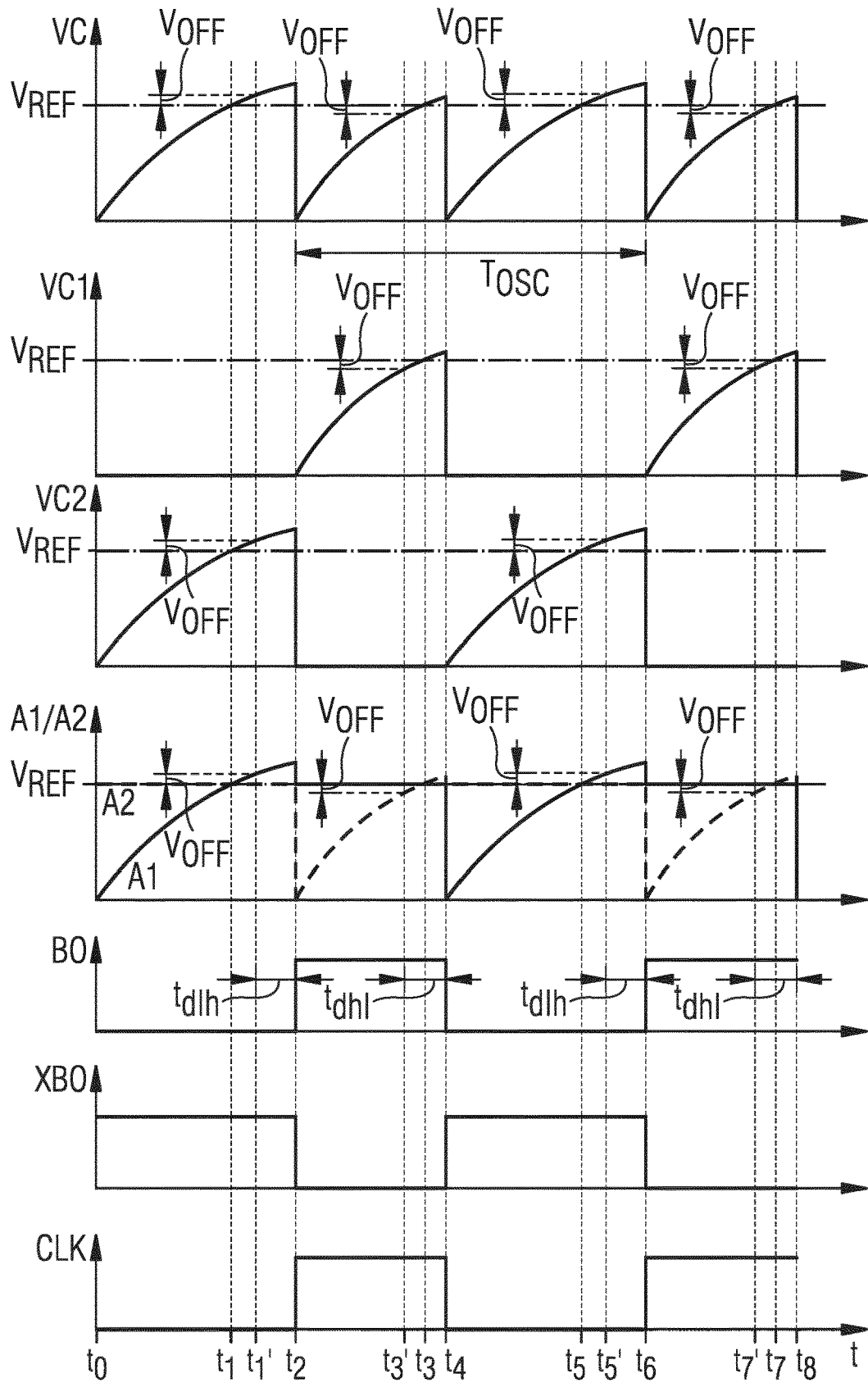
FIG. 4 shows a waveform diagram of signals from the circuit of FIG. 3.

FIG. 4 depicts waveforms of several signals over time taken from nodes from the circuit of FIG. 3.

The reference voltage VREF at terminal 405 assuming infinite impedance of the comparator 510 is given by $$V_{REF} = V_{DD}\frac{R_1}{R_1 + R_2}. \tag{101}$$

It is assumed that at $t=t_0$ all the signals are in the default state ensured by the start-up circuit and that the supply voltage $V_{DD}$ and reference voltage $V_{REF}$ are settled.

$$VC=VC1=VC2=A1=A2=0. \tag{102}$$

$$B0='0' \text{ (low)}. \tag{103}$$

$$XB0='1' \text{ (high)}. \tag{104}$$

$$CLK='0' \text{ (high)}. \tag{105}$$

As a result of the circuit state, the following is true:
Switches 131, 133, 411 and 413 are closed (132, 134, 412, and 414 are open)
VC2←VC
VC1←GND
A2←VC
A2←$V_{REF}$
Capacitor 110 and 120 are connected in parallel, having the total capacitance equal to $C_{REF}$
Node A1←VC2←VC is charged through the reference resistor $R_{REF}$ to VDD Consequently, the following formula describes the waveform of A1←VC2←VC within the time interval $(t_0 \sim t_2)$:

$$A1(t) = VC2(t) = VC(t) = VDD \cdot \left[1 - \exp\left(-\frac{t}{R_{REF} \cdot C_{REF}}\right)\right] \tag{106}$$

At $t=t_1$ voltage A1 becomes equal to the reference voltage A2←$V_{REF}$. Nevertheless, the comparison only begins at $t=t_1'$ when A1 becomes equal to $(V_{REF}+V_{OFF})$, resulting from the input referred offset voltage of the comparator. Moreover, as a result of the comparator delay, additional time is needed in order to change the state of the comparator output from low to high state, namely $t_{dlh}$. Finally, the state of the comparator output B0 becomes high at $t=t_2$.

As a result of the change of the state of the comparator output B0, the following is true at $t_{2+}$:
B0='1' (high)
XB0='0' (low)
CLK='1' (high)
Switches 132, 134, 412, and 414 are closed (131, 133, 411 and 413 are open)
VC1←VC
VC2←GND
A1←$V_{REF}$
A2←VC
Since the charges of capacitors 110 and 120 are equal at $t=t_{2-}$, at $t=t_{2+}$ the charges are redistributed between the capacitors and equal zero
Capacitor 110 and 120 are connected in parallel, having the total capacitance equal to $C_{REF}$
Node A2←VC1←VC is charged through the reference resistor $R_{REF}$ to VDD, having 0 V at $t=t_{2+}$ as a result of zero charge on the capacitors 110 and 120

Consequently, the following formula describes the waveform of A2←VC1←VC within the time interval (t₂~t₄):

$$A2(t) = VC1(t) = VC(t) = VDD \cdot \left[1 - \exp\left(-\frac{t - t_2}{R_{REF} \cdot C_{REF}}\right)\right] \quad (107)$$

At t=t₃ voltage A2 becomes equal to the reference voltage A1←V$_{REF}$. Nevertheless, the comparison only begins at t=t₃' when A2 becomes equal to (V$_{REF}$−V$_{OFF}$). resulting from the offset voltage of the comparator. Moreover, as a result of the comparator delay, additional time is needed in order to change the state of the comparator output from high to low state, namely t$_{dhl}$. Finally, the state of the comparator output B0 becomes low at t=t₄.

As a result of the change of the state of the comparator output B0, the following is true at t$_{4+}$:
- B0='0' (low)
- XB0='1' (high)
- CLK='0' (low)
- Switches 131, 133, 411 and 413 are closed (132, 134, 412, and 414 are open)
- VC1←GND
- VC2←VC
- A1←VC
- A2←V$_{REF}$
- Since the charges of capacitors 110 and 120 are equal at t=t$_{4−}$, at t=t$_{4+}$ the charges are redistributed between the capacitors and equal zero
- Capacitor 110 and 120 are connected in parallel, having the total capacitance equal to C$_{REF}$
- Node A1←VC2←VC is charged through the reference resistor R$_{REF}$ to VDD, having 0 V at t=t$_{4+}$ as a result of zero charge on the capacitors 110 and 120

Consequently, the following formula describes the waveform of A1←VC2←VC within the time interval (t₄~t₆):

$$A1(t) = VC2(t) = VC(t) = VDD \cdot \left[1 - \exp\left(-\frac{t - t_4}{R_{REF} \cdot C_{REF}}\right)\right] \quad (108)$$

At t=t₅ is voltage A1 becomes equal to the reference voltage A2←V$_{REF}$. Nevertheless, the comparison only begins at t=t₅' when A1 becomes equal to (V$_{REF}$+V$_{OFF}$) resulting from the offset voltage of the comparator. Moreover, as a result of the comparator delay, additional time is needed in order to change the state of the comparator output from low to high state, namely t$_{dlh}$. Finally, the state of the comparator output B0 becomes high at t=t₆.

From the analysis it can be concluded that the circuit has a periodic behavior, for instance, since the time interval (t₄~t₆) is identical to the time interval (t₀~t₂), the following time interval (t₆~t₈) is identical to the time interval (t₂~t₄), and so on.

For this reason, the time interval (t₂~t₆) completely describes one period of the circuit, and the oscillation period can be expressed as $$T_{osc} = t_6 - t_2 = (t_3' - t_2) + (t_4 - t_3') + (t_5' - t_4) + (t_6 - t_5'). \quad (109)$$

From (107), the following is valid:

$$VC(t_3') = V_{REF} - V_{OFF} = V_{DD}\left[1 - \exp\left(-\frac{t_3' - t_2}{R_{REF} \cdot C_{REF}}\right)\right], \quad (110)$$

-continued $$\frac{V_{REF}}{V_{DD}} - \frac{V_{OFF}}{V_{DD}} = 1 - \exp\left(-\frac{t_3' - t_2}{R_{REF} \cdot C_{REF}}\right), \quad (111)$$

$$t_3' - t_2 = -R_{REF} \cdot C_{REF} \cdot \ln\left(1 - \frac{V_{REF}}{V_{DD}} + \frac{V_{OFF}}{V_{DD}}\right). \quad (112)$$

Furthermore, from (108), the following is valid $$VC(t_5') = V_{REF} - V_{OFF} = V_{DD}\left[1 - \exp\left(-\frac{t_5' - t_4}{R_{REF} \cdot C_{REF}}\right)\right], \quad (113)$$

$$\frac{V_{REF}}{V_{DD}} - \frac{V_{OFF}}{V_{DD}} = 1 - \exp\left(-\frac{t_5' - t_4}{R_{REF} \cdot C_{REF}}\right), \quad (114)$$

$$t_5' - t_4 = -R_{REF} \cdot C_{REF} \cdot \ln\left(1 - \frac{V_{REF}}{V_{DD}} + \frac{V_{OFF}}{V_{DD}}\right). \quad (115)$$

Also, the time intervals (t₃'~t₄) and (t₅'~t₆) are already defined as $$(t_4 - t_3') = t_{dhl}, \quad (116)$$

$$(t_6 - t_5') = t_{dlh}. \quad (117)$$

Consequently, the oscillation period can be expressed as:

$$T_{osc} = -R_{REF} \cdot C_{REF} \cdot \ln\left(1 - \frac{V_{REF}}{V_{DD}} + \frac{V_{OFF}}{V_{DD}}\right) + \quad (118)$$
$$t_{dlh} - R_{REF} \cdot C_{REF} \cdot \ln\left(1 - \frac{V_{REF}}{V_{DD}} - \frac{V_{OFF}}{V_{DD}}\right) + t_{dhl},$$

otherwise written as $$T_{osc} = -R_{REF} \cdot C_{REF} \cdot \ln\left[\left(1 - \frac{V_{REF}}{V_{DD}}\right)^2 - \left(\frac{V_{OFF}}{V_{DD}}\right)^2\right] + t_{dlh} + t_{dhl}. \quad (119)$$

Since the following expression is usually valid for the relaxation oscillators:

$$\left(1 - \frac{V_{REF}}{V_{DD}}\right)^2 \gg \left(\frac{V_{OFF}}{V_{DD}}\right)^2, \quad (120)$$

(119) can be further simplified to:

$$T_{osc} \approx -2 \cdot R_{REF} \cdot C_{REF} \cdot \ln\left[1 - \frac{V_{REF}}{V_{DD}}\right] + t_{dlh} + t_{dhl}. \quad (121)$$

Furthermore, according to (101) the following is valid:

$$\frac{V_{REF}}{V_{DD}} = \frac{R_1}{R_1 + R_2}, \quad (122)$$

meaning the final expression for the oscillation period is $$T_{osc} \approx 2 \cdot R_{REF} \cdot C_{REF} \cdot \ln\left[1 + \frac{R_1}{R_2}\right] + t_{dlh} + t_{dhl}. \quad (123)$$

As a result, according to (123), the oscillation period is determined by the reference elements, R$_{REF}$ and C$_{REF}$, ratio of the voltage divider resistors, R₁ and R₂, and propagation delays of the comparator, $t_{dlh}$ and $t_{dhl}$, while the contribution of the offset voltage is cancelled.

Figure 5:
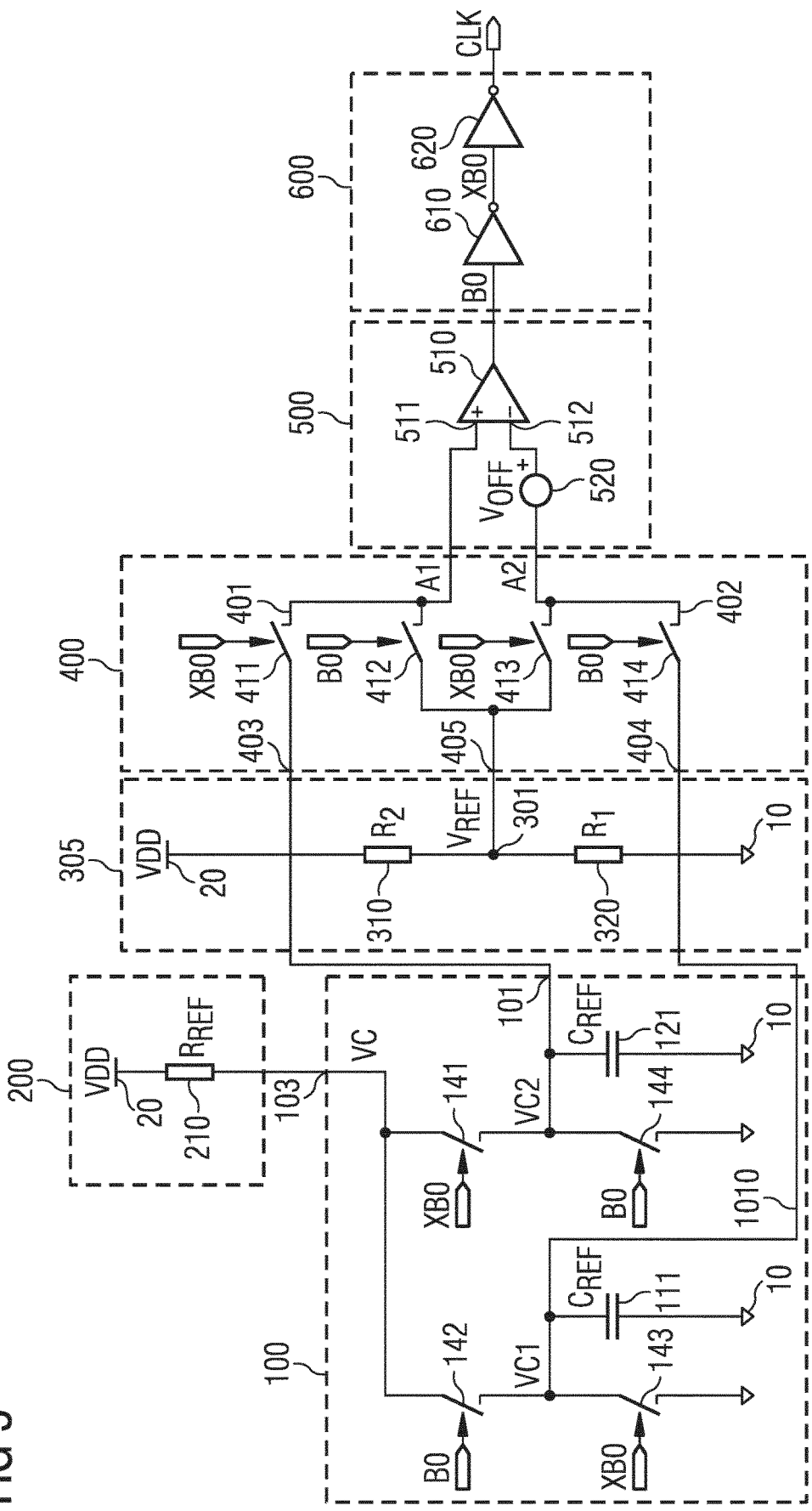
FIG. 5 shows yet another embodiment of an oscillator circuit arrangement according to the principles set forth in this disclosure.

FIG. 5 shows an alternative embodiment of an oscillator circuit according to the principles of the present disclosure. The oscillator of FIG. 5 uses a different switched capacitor circuit 100 which comprises two switched capacitors 111, 121 rather than a rotating capacitor. The current source 200 is formed by resistor 210 and the reference voltage generator 305 is an ohmic voltage divider comprising resistors 310, 320, the same as in the oscillator circuit of FIG. 3.

The switched capacitor circuit 100 of the oscillator of FIG. 5 comprises a first capacitor 121 having capacitance CREF connected between the output node 101 of switched capacitor circuit 100 and ground potential terminal 10. A switch 141 is connected between the top plate of capacitor 121 and current supply node 103. Another switch 144 is connected in parallel to capacitor 121 between output node 101 and ground potential terminal 10. Switches 141, 144 are operated by complementary signals XB0, B0 supplied by buffer circuit 600. Switched capacitor circuit 100 comprises a second capacitor 111 having capacitance CREF connected to another output terminal 1010 of circuit 100. A switch 142 is connected between the top plate of capacitor 111 and the current supply node 103. Another switch 143 is connected in parallel to capacitor 111 between the output node 1010 and reference potential terminal 10. Switches 142, 143 are operated by complementary control signals B0, XB0 supplied by buffer circuit 600 so that also switches 141, 142 are operated complementary to each other and switches 144, 143 are operated complementary to each other. The first output terminal 101 of circuit 100 is connected to the first input terminal 403 of the chopper circuit 400 and the second output terminal 1010 of circuit 100 is connected to the second input terminal 404 of chopper circuit 400. During operation, the behaviour of several nodes of the circuit of FIG. 5 is the same as the behaviour of the nodes of the circuit of FIG. 3 so that the waveform diagram of FIG. 4 depicting several signals also applies to the oscillator circuit of FIG. 5.

The concept of using a switched capacitor circuit and a chopper stage in connection with a comparator stage further including a buffer stage with inverters and buffers only without a latch circuit in the buffer stage, can be applied to many types of switched capacitor circuits of which two types, such as the rotating capacitor circuit of FIGS. 1 and 3 and the switched capacitor circuit of FIG. 5 are shown as representative embodiments. Switched capacitor stages that perform an RC behaviour to charge and discharge the switched capacitor are also possible. The switched capacitor circuit should include at least one capacitor which has at least one terminal which is selectively coupled to a supply terminal or to a ground potential terminal to perform the switched operation of the capacitor with charging, discharging and integration phases.

Figure 6:
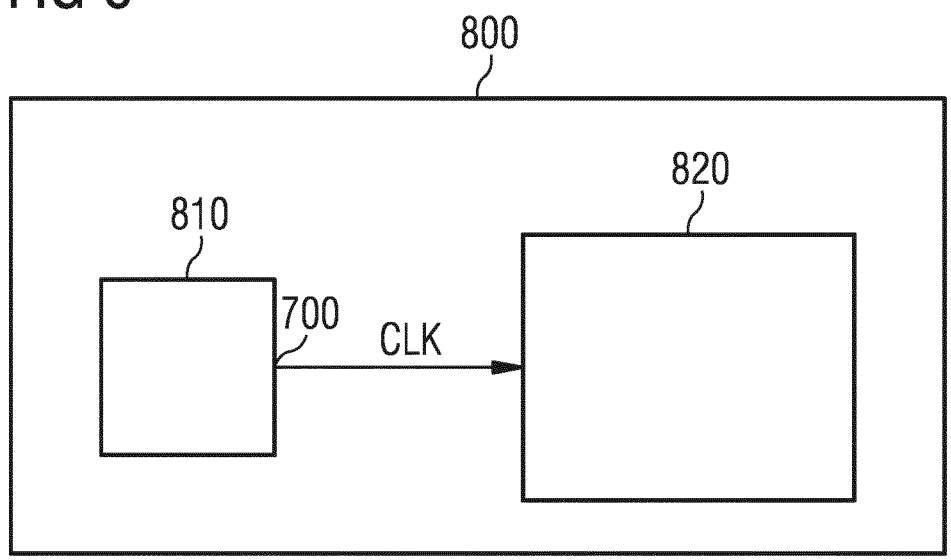
FIG. 6 shows a block diagram of an electronic circuit including an oscillator circuit arrangement.

FIG. 6 shows an electronic system 800 such as an optoelectronic device which includes a relaxation oscillator circuit arrangement 810 according to the principles of the present disclosure described above. Device 800 includes a circuit portion 820 which is a digital circuit which may include a processor and other digitally operating circuits that require a clock signal for time discrete operation. The output signal CLK at terminal 700 of oscillator circuit 810 is supplied as a time base to the digital circuit portion 820. The operational clocks used in digital circuit block 820 may be directly derived from clock signal CLK or may be clock signals having a multiple of the frequency of the clock signal CLK or having a reduced, divisional frequency compared to the frequency of the clock signal CLK. The oscillator circuit arrangement 810 provides a clock signal of high stability being temperature stable and relatively insensitive to variations of the supply voltage. The oscillator is self-recoverable after a disturbance such as a voltage spike in the supply voltage or an EMI event.

The disclosed oscillator circuits have a stable output clock frequency in that the output clock frequency is determined by parameters of the circuit such as RREF and CREF which can be manufactured in a controlled manner, wherein the offset voltage of the comparator has no effect on the output frequency as it is cancelled out.

It will be apparent to those skilled in the art that various modifications and variations can be made without departing from the spirit or scope of the disclosure as laid down in the appended claims. Since modifications, combinations, sub-combinations and variations of the disclosed embodiments incorporating the spirit and substance of the disclosure may occur to the persons skilled in the art, the disclosure should be construed to include everything within the scope of the appended claims.

The invention claimed is:

1. An oscillator circuit arrangement, comprising:
a switched capacitor circuit having at least one output terminal, a supply terminal and a terminal for ground potential, comprising at least one capacitor having at least one terminal, the switched capacitor circuit configured to selectively couple the at least one terminal to one of the supply terminal and the terminal for ground potential, the output terminal coupled to the at least one capacitor;
a chopper circuit having a first input terminal and a second input terminal connected to the switched capacitor circuit, a terminal for a reference potential, a first output terminal and a second output terminal, the chopper circuit configured to selectively couple the first output terminal to one of the first input terminal and the terminal for a reference potential and to couple the second output terminal to one of the second input terminal and the terminal for a reference potential;
a comparator circuit having input terminals connected to the output terminals of the chopper circuit and an output terminal;
a buffer circuit including at least one buffer connected to the output terminal of the comparator circuit, to the switched capacitor circuit to control selective coupling of the at least one capacitor and to the chopper circuit (400) to control selective coupling of the first and second output terminals; and
an output terminal connected to the buffer circuit to supply a clock signal,
wherein the switched capacitor circuit comprises a fifth, a sixth, a seventh and an eighth switch, wherein the at least one terminal of the at least one capacitor is connected to the output terminal of the switched capacitor circuit through the sixth switch and to the terminal for ground potential through the seventh switch, wherein another terminal of the at least one capacitor is connected to the output terminal of the switched capacitor circuit through the fifth switch and to the terminal for ground potential through the eighth switch, wherein the fifth and seventh switches are operated in phase with each other and the sixth and eighth switches are operated out of phase or complementary with the fifth and seventh switches.

2. The oscillator circuit arrangement of claim 1, wherein the chopper circuit is configured to couple the first input terminal of the chopper circuit to the first output terminal of the chopper circuit and the terminal for a reference potential to the second output terminal of the chopper circuit and, subsequently, to couple the second input terminal of the chopper circuit to the second output terminal of the chopper circuit and the terminal for a reference potential to the first output terminal of the chopper circuit.

3. The oscillator circuit arrangement of claim 1, wherein the chopper circuit comprises a first, a second, a third and a fourth switch, the first switch connected between the first input terminal of the chopper circuit and the first output terminal of the chopper circuit, the second switch connected between the terminal for a reference potential and the first output terminal of the chopper circuit, the third switch connected between the terminal for a reference potential and the second output terminal of the chopper circuit, the fourth switch connected between the second input terminal of the chopper circuit and the second output terminal of the chopper circuit, the first and the third switches operated in phase with each other and operated out of phase or complementary with the second and fourth switches.

4. The oscillator circuit arrangement of claim 3, wherein the first and the third switches of the chopper circuit are controlled by the at least one buffer of the buffer circuit and the second and fourth switches are controlled complementary to the first and third switches.

5. The oscillator circuit arrangement of claim 3, wherein the first and the third switches of the chopper circuit are controlled by an output signal of the at least one buffer of the buffer circuit and the second and fourth switches are controlled by an input signal to the at least one buffer of the buffer circuit.

6. The oscillator circuit arrangement of claim 1, wherein the fifth and the seventh switches of the switched capacitor circuit are controlled by an output signal of the at least one buffer of the buffer circuit and the sixth and the eighth switches are controlled by an input signal to the at least one buffer.

7. The oscillator circuit arrangement of claim 1, the switched capacitor circuit further comprising another capacitor connected between the output terminal of the switched capacitor circuit and the terminal for ground potential, wherein the supply terminal is connected to the output terminal of the switched capacitor circuit.

8. The oscillator circuit arrangement of claim 1, the switched capacitor circuit further comprising another capacitor and another output terminal, the other capacitor connected to the other output terminal of the switched capacitor circuit, wherein the supply terminal is coupled to the at least one capacitor and the other capacitor through switches.

9. The oscillator circuit arrangement of claim 1, further comprising a constant current source connected to the supply terminal of the switched capacitor circuit.

10. The oscillator circuit arrangement of claim 9, further comprising a reference voltage generator comprising another constant current source and a resistor serially connected with the other constant current source, wherein a node disposed between the other constant current source and the resistor is connected to the terminal for a reference potential of the chopper circuit.

11. The oscillator circuit arrangement of claim 1, further comprising a resistor connected to the supply terminal of the switched capacitor circuit.

12. The oscillator circuit arrangement of claim 11, further comprising a voltage divider connected between a terminal for a supply potential and the terminal for ground potential, an output terminal of the voltage divider connected to the terminal for a reference potential of the chopper circuit.

13. An electronic device, comprising:
a digital circuit portion configured to operate clockwise in response to a clock signal; and
the oscillator circuit arrangement according to claim 1, wherein the clock signal is derived from the clock signal supplied at the output terminal of the oscillator circuit.

* * * * *